United States Patent [19]

Kondow et al.

[11] Patent Number: 4,841,531
[45] Date of Patent: Jun. 20, 1989

[54] SEMICONDUCTOR LASER DEVICE

[75] Inventors: Masahiko Kondow, Kokubunji; Shin Satoh, Iruma; Shigekazu Minagawa, Tokyo; Akio Ohishi, Tokyo; Takashi Kajimura, Tokyo, all of Japan

[73] Assignee: Hitachi, Ltd., Tokyo, Japan

[21] Appl. No.: 155,058

[22] Filed: Feb. 11, 1988

[30] Foreign Application Priority Data

Feb. 12, 1987 [JP] Japan .................................. 62-28207

[51] Int. Cl.$^4$ ............................................. H01S 3/19
[52] U.S. Cl. ......................................... 372/43; 357/16; 357/17; 357/61; 372/45
[58] Field of Search ............... 372/45, 43, 44; 357/16, 357/17, 61

[56] References Cited

U.S. PATENT DOCUMENTS 4,494,237  1/1985  Di Forte Poisson et al. ........ 372/45
4,759,024  7/1988  Hayakawa et al. .................... 372/45

OTHER PUBLICATIONS

Suzuki, Papers at the Meeting for Publication of Results of R&D on Applied Optical Measurement and Control System; OAR-R-No. 6, pp. 175–189.
Ludowise et al, Stimulated Mission in Strained $GaAs_{1-x}P_x$–$GaAs_{1-y}P_y$ Superlattices; Appl. Phys. Lett. 42(3), Feb. 1983, pp. 257–259.
Ludowise et al, Continuous 300-K Laser Operation of Strained Superlattices; Appl. Phys. Lett. 42(6), Mar. 1983, pp. 487–489.

*Primary Examiner*—James W. Davie
*Attorney, Agent, or Firm*—Antonelli, Terry & Wands

[57] ABSTRACT

A semiconductor laser having a double hetero structure comprises a cladding layer of $In_{1-x-y}Ga_xAl_yP_{1-z}As_z$ ($0 \leq x \leq 1$, $0 \leq y \leq 1$, $0 \leq z \leq 0.5$, $0.5 \leq x+y \leq 1$) and an active layer of a strained-layer-superlattice of $In_{1-x-y}Ga_xAl_yP_{1-z}As_z$ ($0 \leq x \leq 1$, $0 \leq y \leq 1$, $0 \leq z \leq 1$, $0 \leq x+y \leq 1$) system, thus enabling the lasing of wavelength ranges from infra-red to green.

3 Claims, 1 Drawing Sheet

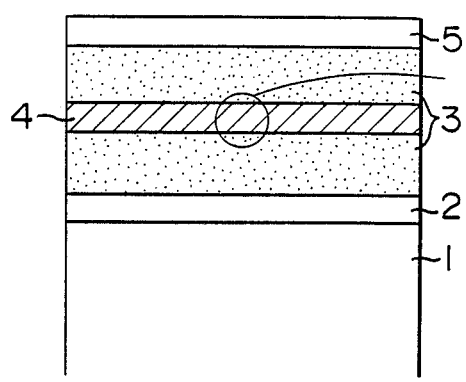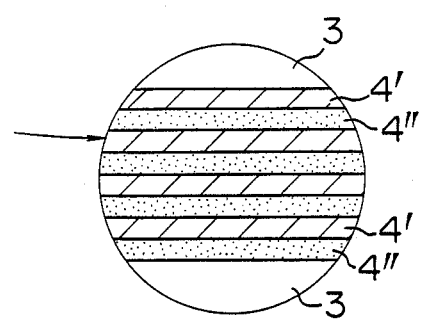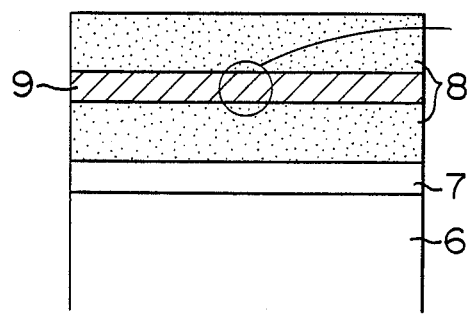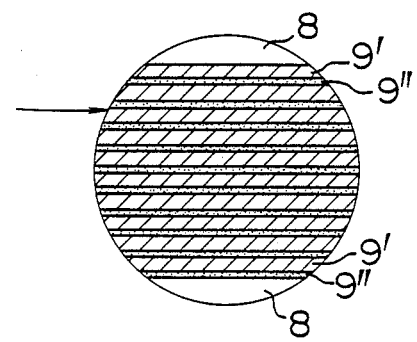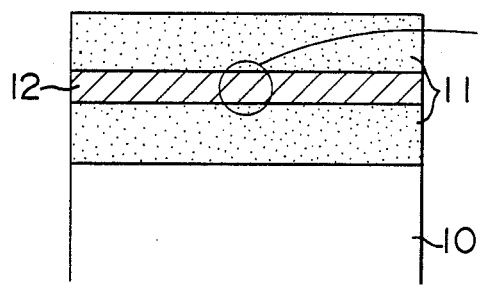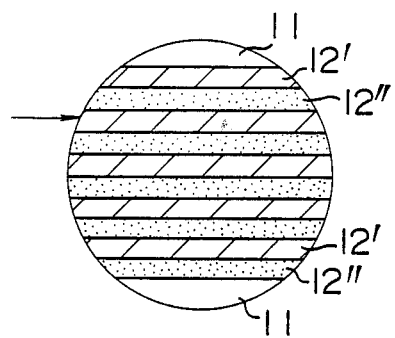

SEMICONDUCTOR LASER DEVICE

BACKGROUND OF THE INVENTION

This invention relates to a visible-light semiconductor laser and more particularly to a semiconductor laser having a wide lasing-wavelength range.

Some visible-light semiconductor lasers emit red light ($\lambda > 600$ nm) at room temperature using an active layer of $In_{0.5}(Ga_{1-x}Al_x)_{0.5}P$ and cladding layers of $In_{0.5}(Ga_{1-y}Al_y)_{0.5}P$ ($y > x$) in lattice-match with a GaAs substrate (see, Suzuki, Papers at the Meeting for publication of the Results of Research and Developments on Applied Optical Measurement and Control System, OAR-R-No. 6 p. 175).

Examples of the strained-layer-superlattice applied to lasers are $GaAs/GaP_xAs_{1-x}$ system and $GaAs/In_{1-x}Ga_xAs$ system, although they emit not visible but infra-red light (see M. J. Ludowise et al., Appl. Phys. Lett. 42 (1983) pp 257–259 and pp 487–489).

SUMMARY OF THE INVENTION

An object of this invention is to provide a semiconductor laser that enables lasing in infra-red to green regions using a strained-layer-superlattice.

The above object is attained by a double-hetero structure semiconductor laser comprising cladding layers of $In_{1-x-y}Ga_xAl_yP_{1-z}As_z$ ($0 \leq x \leq 1$, $0 \leq y \leq 1$, $0 \leq z \leq 0.5$, $0.5 \leq x+y \leq 1$) and an active layer constituted by a strained-layer-superlattice of $In_{1-x-y}Ga_xAl_yP_{1-z}As_z$ ($0 \leq x \leq 1$, $0 \leq y \leq 1$, $0 \leq z \leq 1$, $0 \leq x+y \leq 1$) system. In this case, the thickness of each of the layers constituting the strained-layer-superlattice is set to up to a critical layer thickness where dislocation does not substantially occur. The material suitably used as a substrate is Si, GaP or GaAs which has a lattice constant close to that of the cladding layer.

BRIEF DESCRIPTION OF THE DRAWINGS

FIG. 1A is a sectional view of a laser structure according to a first embodiment of this invention;

FIG. 1B is an enlarged sectional view in the neighborhood of the active layer shown in FIG. 1A;

FIG. 2A is a sectional view of a laser structure according to a second embodiment of this invention;

FIG. 2B is an enlarged sectional view in the neighborhood of the active layer shown in FIG. 2A;

FIG. 3A is a sectional view of a laser structure according to a third embodiment of this invention;

FIG. 3B is an enlarged sectional view in the neighborhood of the active layer shown in FIG. 3A.

DESCRIPTION OF THE PREFERRED EMBODIMENTS

In the conventional InGaAlP system double hetero structure laser diode, only GaAs has been used as a substrate material in order to make lattice-matching with the double hetero structure formed on the substrate. In this case, the material having the largest bandgap in direct-transition type materials used as an active layer is $In_{0.5}Ga_{0.25}Al_{0.25}P$ with the bandgap of 2.25 eV ($\lambda = 550$ nm corresponding to yellow-green). On the other hand, the material having the largest bandgap in materials used as the cladding layer is $In_{0.5}Al_{0.5}P$ with the bandgap of 2.3 eV. The bandgap difference between both $In_{0.5}Ga_{0.25}Al_{0.25}P$ and $In_{0.5}Al_{0.5}P$ is as small as 0.05 eV, which does not permit the above laser diode to cause lasing. Thus, lasing with a wavelength nor more than 600 nm is very difficult to produce. Also, it is almost impossible to implement a green-light-emitting light.

To solve the above problem, it is proposed to replace the cladding layer by a material having a larger bandgap. The material having the largest bandgap in III-V compound materials is AlP with a bandgap of 2.34 eV. If AlP is used as a cladding layer, the bandgap difference between the cladding layer and the active layer is a value sufficient to cause the lasing. However, the difference in the lattice constant between both layers is as large as 3 to 4%, which make it impossible to provide a good crystal with lattice-matching.

However, if the strained-layer-superlattice, which is a technique of piling up the materials having different lattice constants, is used, the above problem of lattice-matching can be solved. Namely, the active layer may be formed in a strained-layer-superlattice structure constituted by, materials which are used for the conventional III-V semiconductor lasers. Further, if the bandgap of an active layer is small, the semiconductor laser having a long lasing wavelength is formed, the $Ga_xAl_{1-x}P$ mixed crystal semiconductor as well as the above AlP can be used as the cladding layer. These materials with In or As added can be used. In this case, the greatest fraction of In or As is 0.5.

Further, the prior art strained-layer-superlattice laser lasing in the infra-red region will involve a problem of misfit dislocation. However, the present invention using a crystal growth technique capable of controlling, in an atomic layer level, the thickness of each of the layers constituting the strained-layer-superlattice, which are designed to a critical layer thickness (generally on the order of 10 Å). Thus, the present invention realizes a strained-layer-superlattice free from any dislocation.

Several embodiments of this invention will be explained below with reference to the drawing.

EMBODIMENT 1

The semiconductor laser according to a first embodiment of this invention is shown in its cross section in FIGS. 1A and 1B. In FIG. 1A, 1 is a GaP substrate; 2 is a GaP buffer layer; 3 is an AlP cladding layer; 4 is a strained-layer-superlattice active layer comprising four AlP layers 4' and four $In_{0.7}Al_{0.3}P$ layers 4'' which are alternately grown as shown in FIG. 1B, each layer being 10 Å thick; and 5 is a GaP cap layer. These layers 2 to 5 are successively crystal-grown by means of the OMVPE technique. The cleaved face of the laser-cavity is covered with a silicon nitride film to prevent the oxidation of AlP. The bandgap in the cladding layer 3 is 2.43 eV and that in the active layer 4 is 2.3 eV and so the bandgap difference therebetween is about 130 meV. When the device thus formed is photo-pumped by means of an argon ion laser at 5145 Å, the lasing of green ($\lambda = 540$ nm) can be observed at room temperature.

EMBODIMENT 2

The semiconductor laser according to a second embodiment of this invention, has different materials for the cladding layer and the active layer and the structure of the strained-layer-superlattice active layer, will be explained with reference to FIGS. 2A and 2B. In FIG. 2A, 6 is a silicon substrate; 7 is a GaP buffer layer; 8 is a $Ga_{0.5}Al_{0.5}P$ cladding layer (Eg=2.34 eV); and 9 is a strained-layer-superlattice active layer (Eg=2.18 eV)

comprising ten GaP layers 9' each 10 Å thick and ten In$_{0.4}$Ga$_{0.6}$P 9'' layers each 20 Å thick, which are alternately grown as shown in FIG. 2B. These layers 7 to 9 are successively epitaxially crystal-grown by means of the OMVPE technique. When the device thus formed is photo-pumped, the lasing of yellow ($\lambda = 570$ nm) can be observed at room temperature.

The semiconductor laser according to this embodiment may be applied to an OEIC since Si is used as the substrate material in this embodiment. More specifically, in this semiconductor laser, only the active layer in the above epitaxially grown layers is different from the Si substrate in their lattice constant, and also this active layer is a strained-layer-superlattice so that the lattice constant difference of the active layer from the Si substrate is released by the straining of the superlattice. Thus, the entire epitaxially grown layers are substantially in lattice-matching with the Si substrate. This permits the elimination of warp of a wafer, which warp has been problematic in the OEIC formed by growing GaAs on the Si substrate, thus greatly increasing the production yield of the OEIC.

EMBODIMENT 3

The semiconductor laser according to a third embodiment of this invention which is formed on a Si substrate and has a lasing wavelength in the wavelength range of a Si photo-diode will be explained with reference to FIGS. 3A and 3B. In FIG. 3A, 10 is a Si substrate; 11 is GaP cladding layers (Eg=2.25 eV); and 12 is a strained-layer-superlattice active layer (Eg=1.4 eV) comprising five GaP layers 12' each 10 Å thick and five In$_{0.5}$Ga$_{0.5}$As layers 12'' each 10 Å thick, which are alternately grown as shown in FIG. 3B. The device thus formed enables the lasing of infra-red ($\lambda = 880$ nm) through photo-pumping.

In the first to third embodiments, the lasing has been carried out through photo-pumping but can be also made through current-injection as in the conventional semiconductor lasers.

Accordingly, this invention can realize a double hetero semiconductor laser having a strained-layer-superlattice which is capable of lasing infra-red to green at room temperature by changing the materials constituting the laser and the strained-layer-superlattice structure.

We claim:

1. In a semiconductor laser device having a double hetero structure semiconductor laser, the improvement comprising said double hetero structure semiconductor laser comprising a cladding layer of In$_{1-x-y}$Ga$_x$Al$_y$P$_{1-z}$As$_z$ ($0 \leq x \leq 1$, $0 \leq y \leq 1$, $0 \leq z \leq 0.5$, $0.5 \leq x+y \leq 1$) and an active layer of a strained-layer superlattice of In$_{1-x-y}$Ga$_x$Al$_y$P$_{1-z}$As$_z$ ($0 \leq x \leq 1$, $0 \leq y \leq 1$, $0 \leq z \leq 1$, $0 \leq x+y \leq 1$) system.

2. A semiconductor laser device according to claim 1, wherein a substrate of said semiconductor laser is made of a material selected from the group consisting of Si, GaP and GaAs.

3. A semiconductor laser device according to claim 1, wherein said cladding layer and said active layer, which constitute the double hetero structure, are epitaxially grown on a substrate of the semiconductor laser.

* * * * *